(12) United States Patent
Kieffel et al.

(10) Patent No.: US 9,510,493 B2
(45) Date of Patent: *Nov. 29, 2016

(54) MIXTURE OF HYDROFLUOROOLEFIN AND FLUOROKETONE FOR USE AS AN INSULATION AND/OR ARC EXTINGUISHING MEDIUM AND A GAS INSULATED MEDIUM-VOLTAGE ELECTRICAL DEVICE COMPRISING SAME

(71) Applicant: SCHNEIDER ELECTRIC INDUSTRIES SAS, Rueil Malmaison (FR)

(72) Inventors: Yannick Kieffel, Saint-Jean-de-Bournay (FR); Alain Girodet, Chassieu (FR); Daniel Piccoz, Lucenay (FR); Romain Maladen, Macon (FR)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 280 days.

This patent is subject to a terminal disclaimer.

(21) Appl. No.: 14/346,597

(22) PCT Filed: Sep. 21, 2012

(86) PCT No.: PCT/EP2012/068686
§ 371 (c)(1),
(2) Date: Mar. 21, 2014

(87) PCT Pub. No.: WO2013/041695
PCT Pub. Date: Mar. 28, 2013

(65) Prior Publication Data
US 2014/0233159 A1 Aug. 21, 2014

(30) Foreign Application Priority Data
Sep. 22, 2011 (FR) ..................................... 11 58456

(51) Int. Cl.
*H05K 13/00* (2006.01)
*H05K 7/02* (2006.01)
(Continued)

(52) U.S. Cl.
CPC .......... *H05K 13/0023* (2013.01); *H01H 33/22* (2013.01); *H02B 13/055* (2013.01); *H05K 7/02* (2013.01); *Y10T 29/49002* (2015.01)

(58) Field of Classification Search
None
See application file for complete search history.

(56) References Cited

U.S. PATENT DOCUMENTS 5,147,702 A * 9/1992 Aoyagi ..................... C09K 3/10
277/606
5,841,088 A * 11/1998 Yamaguchi ............ H01H 9/302
218/158
(Continued)

FOREIGN PATENT DOCUMENTS

DE   20 2009 009 305 U1   12/2009
DE    20 2009 009305 U1   12/2009
(Continued)

OTHER PUBLICATIONS

U.S. Appl. No. 14/119,352, filed Feb. 11, 2014, Kieffel, et al.
(Continued)

*Primary Examiner* — Jeremy C Norris
*Assistant Examiner* — Muhammed Azam
(74) *Attorney, Agent, or Firm* — Oblon, McClelland, Maier & Neustadt, L.L.P.

(57) ABSTRACT

There is provided a method of providing an electric insulating and/or electric arc extinguishing gaseous medium within a sealed enclosure of a medium-voltage electrical device comprising electrical components, the method including enclosing the gaseous medium in the sealed enclosure, wherein the gaseous medium includes a hydrofluoroolefin comprising three carbon atoms and a fluoroketone comprising five carbon atoms. There is also provided a medium-voltage electrical device, including a sealed enclosure comprising electrical components; and a gaseous medium provided within the sealed enclosure, the gaseous medium being an electric insulating and/or electric arc extinguishing medium, wherein the gaseous medium comprises a hydrofluoroolefin comprising three carbon atoms and a fluoroketone comprising five carbon atoms.

15 Claims, 4 Drawing Sheets

(51) Int. Cl.
*H02B 13/055* (2006.01)
*H01H 33/22* (2006.01)

(56) References Cited

U.S. PATENT DOCUMENTS

| | | | |
|---|---|---|---|
| 7,655,610 B2 | 2/2010 | Singh et al. | |
| 8,660,421 B2 | 2/2014 | Staker et al. | |
| 8,680,421 B2 * | 3/2014 | Hyrenbach | H01B 3/56 218/118 |
| 9,196,431 B2 | 11/2015 | Hyrenbach et al. | |
| 2007/0131535 A1 * | 6/2007 | Shiflett | B01D 3/14 203/50 |
| 2010/0123095 A1 | 5/2010 | Minor et al. | |
| 2010/0127209 A1 | 5/2010 | Singh et al. | |
| 2010/0271819 A1 * | 10/2010 | Kristoffersen | F21V 29/004 362/235 |
| 2011/0232306 A1 * | 9/2011 | Hulse | C09K 5/047 62/112 |
| 2011/0289748 A1 | 12/2011 | Singh et al. | |
| 2012/0145521 A1 | 6/2012 | Glasmacher | |
| 2013/0215555 A1 | 8/2013 | Kieffel et al. | |

FOREIGN PATENT DOCUMENTS

| | | |
|---|---|---|
| DE | 20 2009 018 239 U1 | 7/2011 |
| DE | 20 2009 018239 U1 | 7/2011 |
| EP | 1 724 802 A2 | 11/2006 |
| WO | WO 2008/073790 A2 | 6/2008 |
| WO | WO 2009/049144 A2 | 4/2009 |

OTHER PUBLICATIONS

U.S. Appl. No. 14/130,786, filed Jan. 3, 2014, Kieffel, et al.
International Search Report issued Nov. 26, 2012, in PCT/EP12/068686 filed Sep. 21, 2012.
French Preliminary Search Report issued Apr. 27, 2012 in Patent Application No. FR 1158456.

* cited by examiner

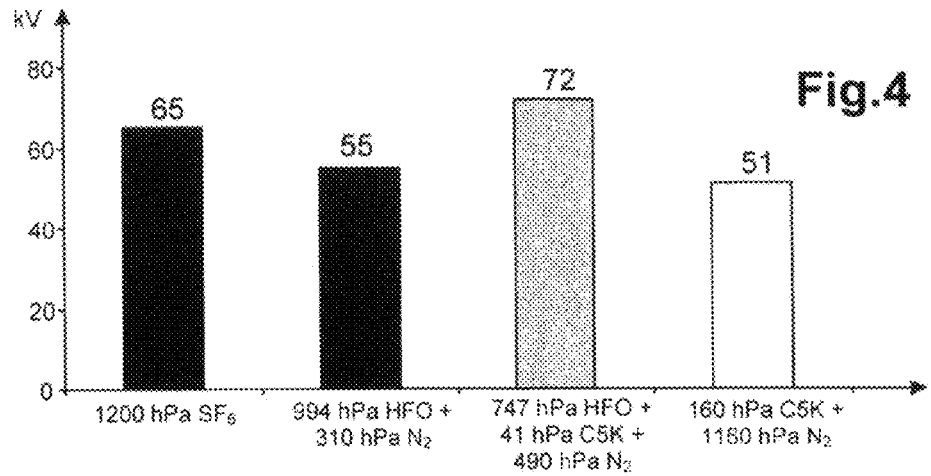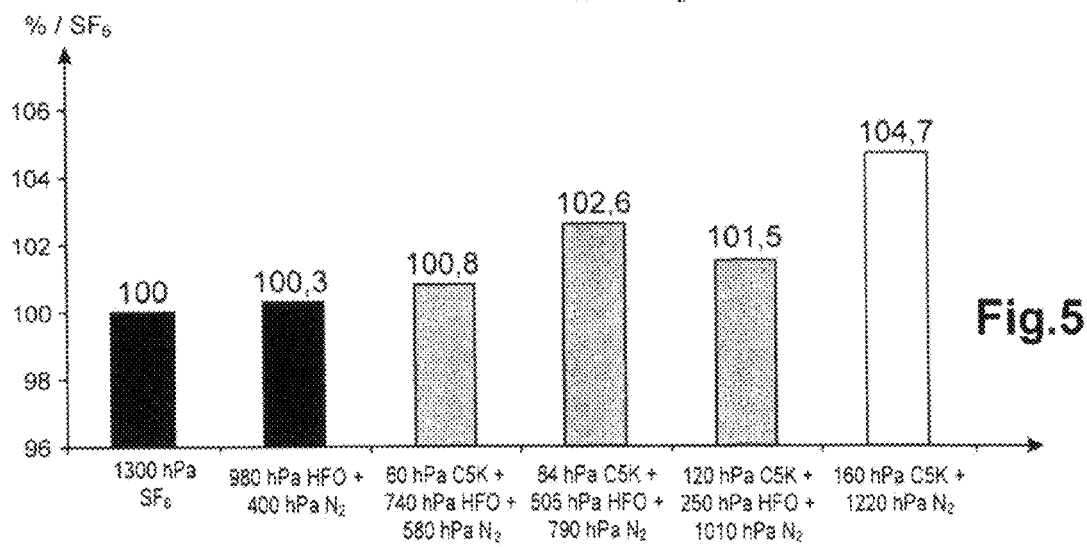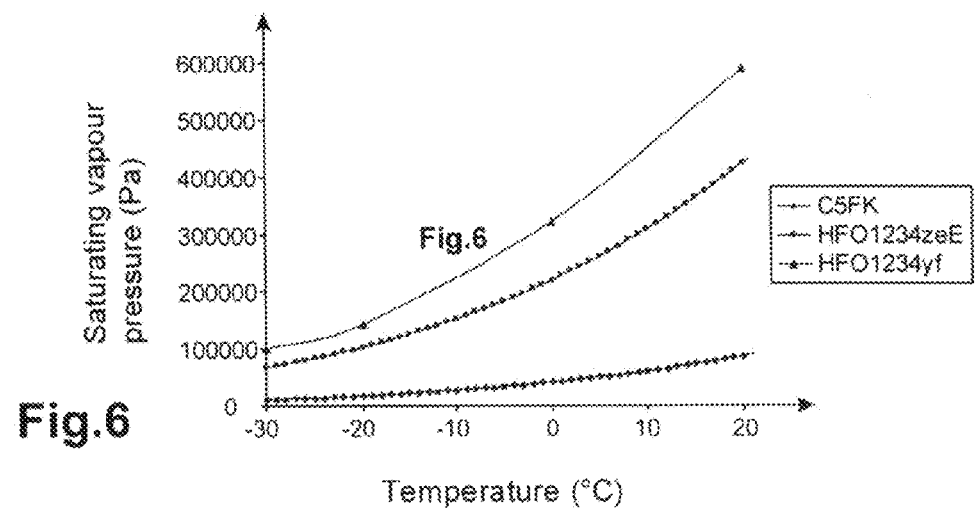

MIXTURE OF HYDROFLUOROOLEFIN AND FLUOROKETONE FOR USE AS AN INSULATION AND/OR ARC EXTINGUISHING MEDIUM AND A GAS INSULATED MEDIUM-VOLTAGE ELECTRICAL DEVICE COMPRISING SAME

TECHNICAL FIELD

The present invention relates to the field of electrical insulation and extinguishing of electrical arcs in medium-voltage devices.

More precisely, it relates to the use of a mixture comprising a particular alkene, namely a hydrofluoroolefin with three carbon atoms, and a vector gas based on a fluoroketone, namely decafluoro-2-methylbutan-3-one, as an insulation and/or arc extinguishing medium in substation electrical devices and particularly in medium-voltage devices. The mixture may comprise other gases for which the global warming potential is lower, and particularly less than or equal to one.

It also relates to substation medium-voltage electrical devices in which the electrical insulation and/or electrical arc extinguishing are provided by a gaseous mixture comprising at least one fluoroketone and one hydrofluoroolefin, the latter compound having the highest global gas warming potential of the gases present in the gaseous medium.

Such an electrical device may notably be an electrical transformer such as a power supply or measurement transformer, a gas-insulated line for transporting or distributing electricity, a set of busbars or an electrical connection/disconnection device (also called a switchgear) such as a circuit breaker, a switch, a unit combining a switch with fuses, a disconnector, an earthing switch or a contactor.

STATE OF THE PRIOR ART

In the foregoing and what follows, the terms "medium-voltage" (MV) and "high-voltage" (HV) are used in their habitual acceptance, namely the term "medium-voltage" means a voltage that is greater than 1 000 volts for alternating current and 1 500 volts for direct current, but that does not exceed 52 000 volts for alternating current and 75 000 volts for direct current, while the term "high-voltage" refers to a voltage that is strictly greater than 52 000 volts for alternating current and 75 000 volts for direct current.

Electrical insulation and possibly extinguishing of electric arcs in medium- or high-voltage electrical devices are typically done by a gas confined inside an enclosure in the devices. At the present time, the most frequently used gas is sulphur hexafluoride ($SF_6$): this gas has a relatively high dielectric strength, a good thermal conductivity and low dielectric losses. It is chemically inert and non-toxic for humans and animals and, after being dissociated by an electric arc, it recombines quickly and almost entirely. It is also uninflammable and its price is still moderate.

However, $SF_6$ has the major disadvantage that it has a global warming potential (GWP) of 22 800 (relative to $CO_2$ over 100 years) and a residence time in the atmosphere of 3 200 years, which places it among gases having a strong global greenhouse effect. Therefore, $SF_6$ was included in the Kyoto Protocol (1997) on the list of gases for which emissions must be limited.

The best way to limit $SF_6$ emissions is to limit the use of this gas, which has led manufacturers to look for alternatives to $SF_6$. In fact, the other solutions such as hybrid systems combining a gas insulation with a solid insulation (EP 1 724 802—reference [1]) increase the volume of the electrical devices relative to the volume that is possible with an $SF_6$ insulation; the cut off in oil or in a vacuum makes it necessary to redesign the devices.

Dielectric gases are known: see for example WO 2008/073790 (reference [2]). However, so-called "simple" gases like air or nitrogen, that have no negative impact on the environment, have a much lower dielectric strength than $SF_6$; their use for electrical insulation and/or extinguishing electrical arcs in HV/MV devices would require drastically increasing the volume and/or the filling pressure of these devices, which goes against efforts that have been made over the past few decades to develop compact and less bulky electrical devices.

Perfluorocarbons ($C_nF_{2n+2}$, $c-C_4F_8$) in general have attractive dielectric strength properties, but their GWP is typically within a range from 5 000 to 10 000. Other alternatives such as trifluoroiodomethane ($CF_3I$) that have promising electrical characteristics and GWP are classified among carcinogenic, mutagenic and reprotoxic substances of category 3, which makes them unacceptable for use on an industrial scale.

Mixtures of $SF_6$ and other gases such as nitrogen or nitrogen dioxide are used to limit the impact of $SF_6$ on the environment; see for example WO-A-2009/049144 (reference [3]). Nevertheless, due to the high GWP of $SF_6$, the GWP of these mixtures remains very high. Thus for example, a mixture of $SF_6$ and nitrogen with a ratio by volume of 10:90 has a dielectric strength in alternating current (50 Hz) equal to 59% of that of $SF_6$ but its GWP is of the order of 8 000 to 8 650. Therefore such mixtures cannot be used as a gas with a low environmental impact.

Thus, only mixtures with a high GWP have a dielectric strength similar to $SF_6$ at low temperature; all mixtures with low GWP known in the prior art can be used to reach not more than 80% of the performances of $SF_6$ devices for the lowest service temperatures; to come close to the performances of $SF_6$, these gaseous mixtures require a new design of the MV or HV devices taking account of longer insulation distances and possibly adding special devices such as screens, deflectors or cladding.

The inventors have thus set themselves the purpose of finding a gas which, while having good properties of electrical insulation and electrical arc extinguishing, has a low or zero impact on the environment. Research led them to envisage a new mixture of gases that can be used in currently marketed medium- or high-voltage electrical devices to replace the $SF_6$ with which such devices are generally filled, throughout their complete service temperature range and particularly at low temperatures.

BRIEF SUMMARY OF THE INVENTION

These aims and others are attained by the invention which proposes, firstly, the use of a gaseous medium comprising at least one hydrofluoroolefin and one fluoroketone as an electrical insulation and/or electrical arc extinguishing medium in a medium-voltage device.

The fluoroketones used are ketones with a carbon chain having five carbon atoms, preferably totally substituted by fluorine and, even more preferably, of decafluoro-2-methylbutan-3-one type, which are not toxic, not corrosive, not explosive, which degrade very rapidly in the atmosphere due to the sensitivity of the —C=O double bond of the ketone group to ultraviolet and thus has a GWP close to 1.

The hydrofluoroolefins used are fluorinated alkenes with a carbon chain having three carbon atoms, preferably of $C_3H_2F_4$ or $C_3HF_5$ type, that are not toxic, not corrosive, not explosive, have an ODP (Ozone Depletion Potential) equal to 0, a GWP less than 10.

These two types of compound are provided with dielectric properties capable of allowing them to replace $SF_6$ as an insulation and/or arc extinguishing gas in substation medium-voltage electrical devices.

According to the invention, the mixture is such that its components are kept in the gas state under temperature and pressure conditions to which it will be submitted once it is confined in the electrical device. The mixture between fluoroketone and hydrofluoroolefin may thus be used alone; nevertheless, the mixture will most usually be diluted with at least one other gas that does not belong to their families, if the boiling point does not make it possible to guarantee it being maintained in the gaseous state at a total pressure sufficient for certain applications which, for example, may require more than $10^5$ Pascals (Pa).

In this case, according to the invention, the other gases used in the gaseous medium have a lower global warming potential than hydrofluoroolefins; the vector gas, or dilution gas, or buffer gas, preferably has a very low boiling point, that is to say typically less than or equal to $-50°$ C. at the standard pressure, and a dielectric strength that is at least equal to the dielectric strength of nitrogen or carbon dioxide. Preferably, the mixture comprises a gas of nitrogen, air, advantageously dry air, oxygen, carbon dioxide type, or a mixture of these gases. The global GWP of the gaseous medium is relative to the partial pressures of each of its components and therefore less than 10, and preferably less than 5.

Advantageously, so as to place the maximum quantity of each of the gases without generating a liquid phase at the minimum service temperature of the device, the composition of the gaseous medium will be defined according to Raoult's law for the minimum service temperature of the device, or even for a temperature slightly above the latter, particularly $3°$ C. above. In particular, for a ternary fluoroketone (FK)/ hydrofluoroolefin (HFO)/dilution gas mixture, the pressures of each constituent will thus be defined by:

$$P_{total} = \frac{P_{HFO} + P_{FK}}{\frac{P_{HFO}}{PVS_{HFO}} + \frac{P_{FK}}{PVS_{FK}}} + P_{dilutiongaz},$$

with PVS=saturated vapour pressure of the gas concerned. Thus, the dielectric properties of the gaseous medium in direct line and in tracking are the highest possible and which as far as possible approach those of $SF_6$.

In the preferred embodiments, the minimum service temperature $T_{min}$ is chosen from: 0, -5, -10, -15, -20, -25, -30, -35, and $-40°$ C. Advantageously, the partial pressure of fluoroketone is comprised between 80 and 120 hPa, particularly for a minimum service temperature of $-25°$ C., with complement in HFO and $N_2$ according to Raoult's law applied at $-22°$ C.

Another purpose of the invention is a medium-voltage electrical device that comprises a sealed enclosure in which electrical components are located together with a gaseous medium providing electrical insulation and/or electrical arc extinguishing within this enclosure, this gaseous medium comprising at least one hydrofluoroolefin and one fluoroketone. The characteristics of the gaseous medium are as disclosed above with regard to its use. The device preferably comprises a $CaSO_4$ molecular sieve.

In accordance with the invention, this electrical device may be a gas-insulated electrical transformer such as, for example, a power supply transformer or a measurement transformer. The electrical device may also be a gas-insulated line, above ground or below ground, or a set of busbars for transporting or distributing electricity. Finally, it may also be an electrical connection/disconnection device (also called a switchgear) such as, for example, a circuit breaker, a switch, a disconnector, a unit combining a switch with fuses, an earthing switch or a contactor.

BRIEF DESCRIPTION OF THE DRAWINGS

Other advantages and characteristics will become clearer from the following description of particular embodiments of the invention given for illustration and in no way limitative, represented in the appended figures.

FIG. 1A illustrates the evolution of the total gas pressure for a ternary mixture, the proportions of which have been defined by Raoult's law for a theoretical appearance of liquid phase at $-25°$ C., FIG. 1B for a theoretical appearance at $-22°$ C.

FIG. 4 shows the results obtained during partial discharge tests.

FIG. 5 shows the results obtained during heating tests.

FIG. 6 represents the saturated vapour pressure of two HFO and of C5K as a function of the temperature.

DETAILED DESCRIPTION OF PARTICULAR EMBODIMENTS

Figure 1A:
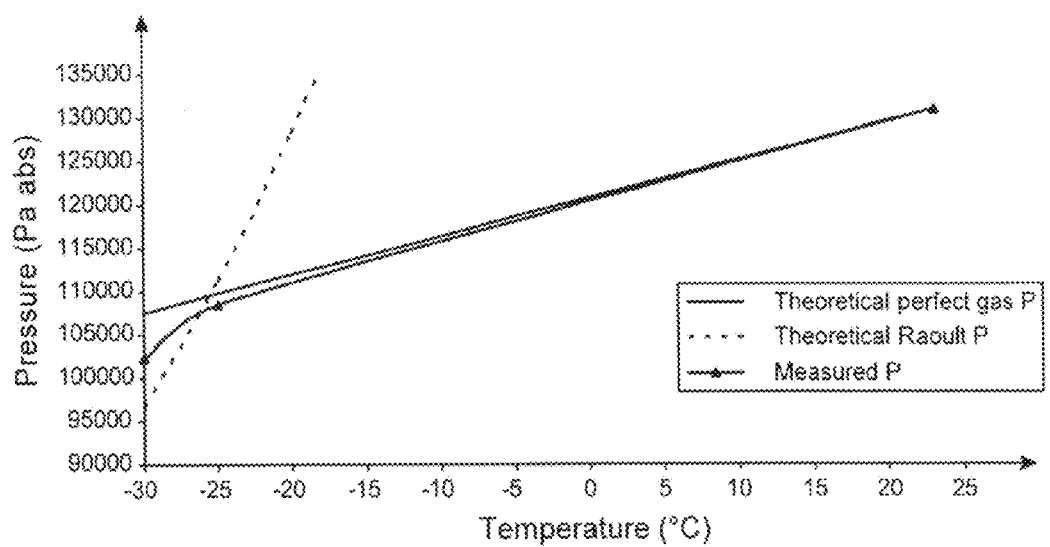
FIGS. 1A and 1B show the saturated vapour pressure in a mixture according to a preferred embodiment of the invention as a function of the temperature.

The invention is based on the use, with or without dilution gas ("buffer" gas such as $N_2$, $CO_2$, air, etc.), of fluoroketones with five carbon atoms (C5K), and hydrofluoroolefins (HFO) with at least three carbon atoms. C5K are ketones substituted by fluorine, uninflammable and their GWP is very low; in particular, the C5K used have the empirical formula $C_5F_{10}O$, and, in particular, decafluoro-2-methylbutan-3-one is selected, which satisfies the semi-developed formula $CF_3$—CO—CF—$(CF_3)_2$, with a global warming potential GWP=1. C5K are not toxic for humans with an occupational exposure limit (the average limit concentration to which most workers might be regularly exposed when working for 8 hours per day for 5 days per week, without being affected by any noxious effect) OEL=1 000 ppm, and a lethal dose $DL_{50}$ causing death of 50% of an animal population equal to more than 200 000 ppm.

HFO are alkenes substituted by fluorine with the general formula $C_n(H,F)_{2n}$; in particular, the HFO used comprise 3 carbon atoms; they are uninflammable and their GWP is less than 10. In particular, hydrofluoroolefin HFO-1234ze, or trans-1,3,3,3-tetrafluoro-1-propene, that satisfies the semi-developed formula CHF=CH—$CF_3$, is used for the following comparative examples. Its environmental impact is GWP=6, and it is not toxic for humans with an OEL=1 000 ppm and a $DL_{50}$>200 000 ppm. Yet, in most conventional very low temperature applications (−30° C., or even −40° C.), HFO is diluted, sometimes to less than 20%, in a nitrogen type neutral vector gas: the mixture is thus not toxic. HFO-1234yf, or 2,3,3,3-tetrafluoro-1-propene, and HFO-1225ye, or 1,2,2,5-pentafluoro-1-propene, may also be envisaged for the mixture according to the invention.

According to the invention, the mixture of HFO and C5K is used in gaseous form regardless of the service temperature of the electrical device. Therefore, the partial pressure of each of these two components should be less than or equal to the pressure calculated according to Raoult's law. In fact, since the molecules of fluoroketones and hydrofluoroolefins are very similar by virtue of their composition, a limitation to their saturated vapour pressure for a given service temperature would generate a liquid phase at temperatures above the desired service temperature on account of interactions.

Depending on the device, the internal pressure of the insulation and/or arc extinguishing medium that is recommended varies; in particular, for different technical reasons, it is interesting to have a sufficiently high total pressure, generally strictly greater than $10^5$ Pa. Since the HFO/C5K mixture is, according to the invention, entirely in gaseous form at the lowest temperature of the electrical device, to satisfy the given filling pressure conditions, a dilution gas, or buffer gas, is added if necessary. Preferably, the dilution gas has a very low boiling point, less than or equal to the minimum service temperature $T_{min}$ of the device, and a dielectric strength greater than or equal to that of $CO_2$ or air in identical test conditions (same device, same geometric configuration, same operating parameters, etc.) to those used to measure the dielectric strength of said gas. Furthermore, according to the invention, the dilution gas used is a gas with low GWP of air or $CO_2$ type: thus, the gaseous medium used as insulation and arc extinguishing medium in electrical devices has a GWP less than or equal to that of the reference HFO. Preferably, for inhomogeneous field devices, carbon dioxide is used; alternatively, a dilution gas with zero GWP, nitrogen $N_2$, is used.

Advantageously, in order to maximise the quantity of each of the fluorinated gases constituting the mixture while not generating a liquid phase at the minimum service temperature of the device for a ternary fluoroketone C5K, hydrofluoroolefin HFO and dilution gas mixture, the pressures of each constituent will thus be defined by the following formula derived from Raoult's law ($P_x$ being the pressure of the gas concerned and $PVS_x$ its saturated vapour pressure):

$$P_{tot} = \frac{P_{HFO} + P_{C5K}}{\frac{P_{HFO}}{PVS_{HFO}} + \frac{P_{C5K}}{PVS_{C5K}}} + P_{dilutiongaz}$$

For example, for a minimum service temperature $T_{min}=-25°$ C., several compositions of mixtures could be used to fill, without formation of liquid, an electrical device with sealed enclosure in which the total filling pressure at 20° C. is 1.3 bars, in other words $1.3 \cdot 10^5$ Pa, as shown in table I below.

TABLE I proportions of a C5K + HFO-1234ze + $N_2$ mixture at $1.3 \cdot 10^5$ Pa

| $P_{C5K}$ | $P_{HFO}$ | $P_{N2}$ |
|---|---|---|
| $0.15 \cdot 10^5$ Pa | $0.05 \cdot 10^5$ Pa | $1.10 \cdot 10^5$ Pa |
| $0.14 \cdot 10^5$ Pa | $0.12 \cdot 10^5$ Pa | $1.04 \cdot 10^5$ Pa |
| $0.13 \cdot 10^5$ Pa | $0.18 \cdot 10^5$ Pa | $0.99 \cdot 10^5$ Pa |

TABLE I-continued proportions of a C5K + HFO-1234ze + $N_2$ mixture at $1.3 \cdot 10^5$ Pa

| $P_{C5K}$ | $P_{HFO}$ | $P_{N2}$ |
|---|---|---|
| $0.12 \cdot 10^5$ Pa | $0.25 \cdot 10^5$ Pa | $0.93 \cdot 10^5$ Pa |
| $0.11 \cdot 10^5$ Pa | $0.31 \cdot 10^5$ Pa | $0.88 \cdot 10^5$ Pa |
| $0.10 \cdot 10^5$ Pa | $0.37 \cdot 10^5$ Pa | $0.83 \cdot 10^5$ Pa |
| $0.09 \cdot 10^5$ Pa | $0.43 \cdot 10^5$ Pa | $0.78 \cdot 10^5$ Pa |
| $0.08 \cdot 10^5$ Pa | $0.49 \cdot 10^5$ Pa | $0.73 \cdot 10^5$ Pa |
| $0.07 \cdot 10^5$ Pa | $0.55 \cdot 10^5$ Pa | $0.68 \cdot 10^5$ Pa |
| $0.06 \cdot 10^5$ Pa | $0.62 \cdot 10^5$ Pa | $0.62 \cdot 10^5$ Pa |
| $0.05 \cdot 10^5$ Pa | $0.68 \cdot 10^5$ Pa | $0.57 \cdot 10^5$ Pa |
| $0.04 \cdot 10^5$ Pa | $0.74 \cdot 10^5$ Pa | $0.52 \cdot 10^5$ Pa |
| $0.03 \cdot 10^5$ Pa | $0.8 \cdot 10^5$ Pa | $0.47 \cdot 10^5$ Pa |
| $0.02 \cdot 10^5$ Pa | $0.86 \cdot 10^5$ Pa | $0.42 \cdot 10^5$ Pa |
| $10^3$ Pa | $0.92 \cdot 10^5$ Pa | $0.37 \cdot 10^5$ Pa |
| $10^2$ Pa | $0.98 \cdot 10^5$ Pa | $0.319 \cdot 10^5$ Pa |

However it appears, by filling an enclosure equipped with a transparent window with such a mixture, there is only appearance of a liquid phase for these mixtures for a temperature less than or equal to −28° C.: Raoult's law thus does not apply totally.

Figure 3A:
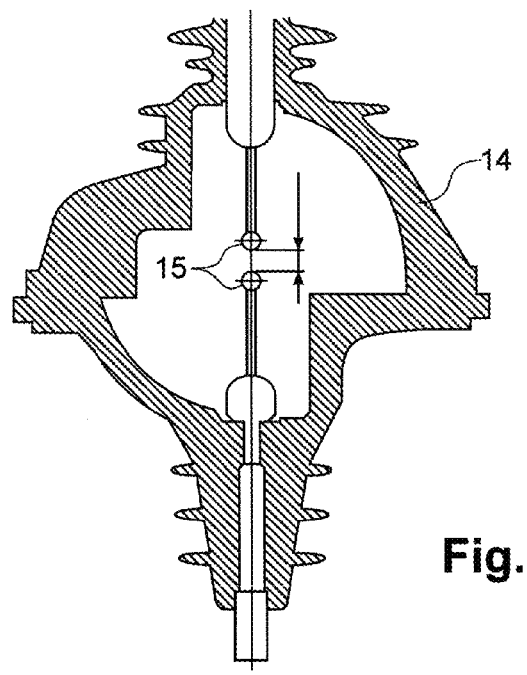
FIG. 3A shows a device in which the dielectric strength tests in direct line have been carried out with a gaseous medium according to the invention.
Figure 3B:
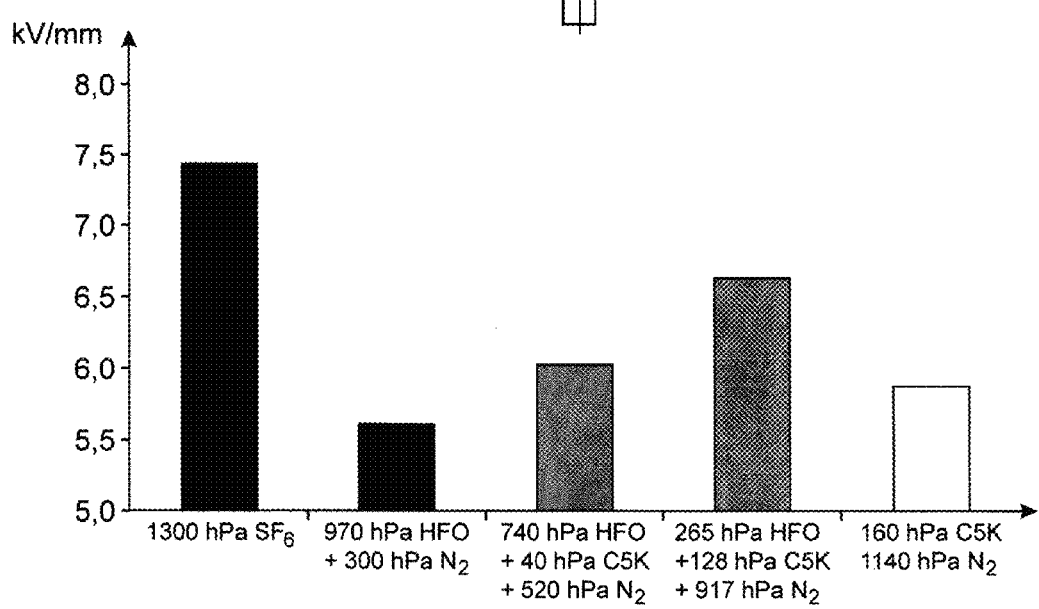
FIG. 3B shows the results synthesised from the device of FIG. 3A.

Yet, the dielectric strength of each of the two fluorinated compounds used in the mixture, pure HFO and pure C5K, is better than that of the dilution gas (see also FIG. 3B). Thus, to increase the dielectric properties of the mixture that derive directly from its molar composition, according to a preferred embodiment of the invention the mixture is optimised to include more fluorinated compound than the theoretical value above; advantageously, the theoretical composition is increased by an addition of C5K to improve the dielectric properties of the gaseous mixture, particularly in tracking, in proportions such that there is no appearance of liquid phase.

In particular, as shown in FIG. 1A, a mixture comprising 40 hPa of C5K, 740 hPa of HFO-1234ze and 520 hPa of nitrogen follows, at high temperature, more or less the curve defined by the perfect gas law; it diverges therefrom at low temperature, particularly below −28° C. (and sometimes before due to the limits of use of the test devices at −20° C. for example), corresponding to the cross-over with the curve illustrating the behaviour of this mixture according to Raoult's law. Consequently, at the lowest temperatures, respecting the values given by Raoult's law is more conservative and makes it possible to ensure the non-appearance of a liquid phase, the zone below the Raoult curve.

Figure 1B:
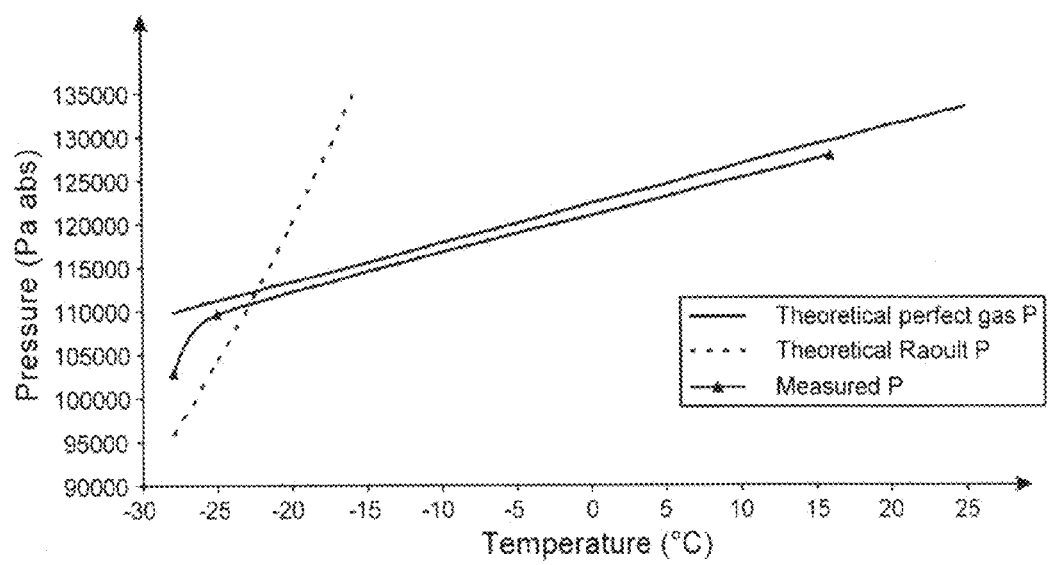

Thus, in FIG. 1B is shown the behaviour of the preceding mixture to which 20 hPa of C5K have been added; obviously, the curve is shifted proportionally below the perfect gas curve at high temperatures. If, theoretically, the appearance of liquid should occur at −22° C., experimentally (see also the break-off of the real curve) the formation of liquid occurs below −25° C.

According to a preferred embodiment of the invention, the composition of each of the components of the ternary mixture is determined by Raoult's law so that there is no appearance of liquid phase at a temperature that can be taken equal to the minimum operating temperature of the device or slightly higher, for example at said minimum temperature less 10%, or preferably at the anticipated minimum service temperature minus 3° C.

Figure 2A:
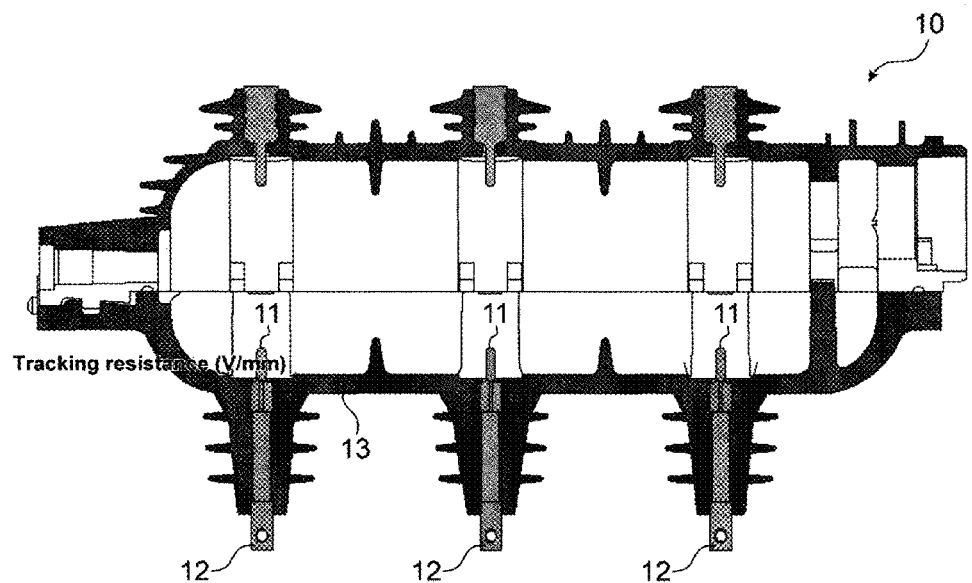
FIG. 2A represents a longitudinal section of the device for the tracking tests.

The gaseous medium according to the invention satisfies the conditions of use of existing devices and its properties are superior to binary mixtures of each fluorinated gas, even $SF_6$, with synergetic effect between the two molecules of hydrofluoroolefin and fluoroketone. In particular, tracking strength tests have been carried out in a device 10 at 1.3÷2 bars (in other words 1300÷2 hPa), shown in FIG. 2A, between two electrodes 11, 251 mm apart, with copper conductors 12 and a silica filled epoxy resin as insulator 13.

Figure 2B:
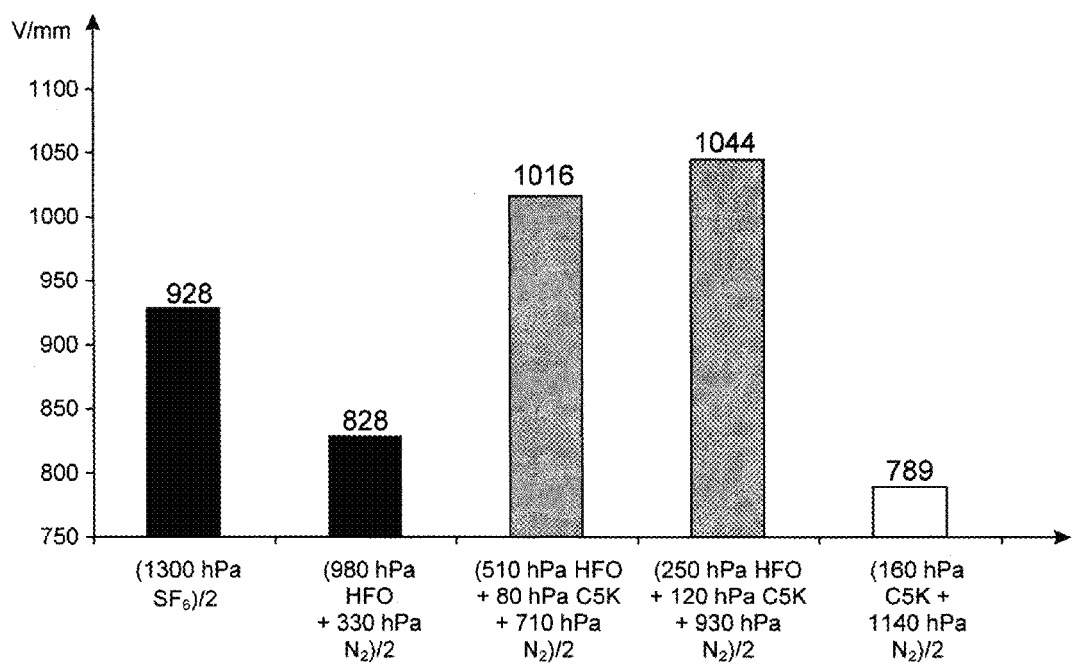
FIG. 2B shows the results synthesised from the device of FIG. 2A.

As shown in FIG. 2B, it may be noted that the ternary mixtures constituted of HFO, C5K and a dilution gas according to the invention have a better tracking resistance than $SF_6$ (more than 1 000 V/mm compared to less than 930 V/mm) on the silica filled epoxide and than binary mixtures of each of the components (these constituents taken in isolation having properties inferior to $SF_6$).

Similarly, dielectric strength tests on a direct line at 1.3 bars (in other words 1300 hPa) show that the performances of the mixture according to the invention are greater than that of the individual components uniquely associated with a dilution gas: FIG. 3A shows the epoxide enclosure 14 filled to 1.3 bars (i.e. 1300 hPa) with $SF_6$ or a mixture of $N_2$ with HFO and/or C5K to measure the dielectric strength between two contacts 15 with a radius of 12 mm, at a distance of 12 mm. A synergetic effect between HFO and C5K is notable for the measured dielectric strength: FIG. 3B.

The advantage of a ternary mixture according to the invention compared to a binary mixture is also visible for partial discharges (FIG. 4): the extinction threshold is even greater than that at 65 kV of $SF_6$ for the ternary mixture, whereas it was lower for the binary mixtures.

In light of the performances of the fluorinated mixture according to the invention, alone or with a simple dilution gas of air or nitrogen type, a use in an existing device may be envisaged. In particular, after having created a vacuum (0 to 0.1 kPa) using an oil-filled vacuum pump, it is possible to fill a GIS type medium-voltage electrical device (the FBX 24 kV device of Schneider Electric for example, filled in its current commercial version with $SF_6$ at a pressure of 1300 hPa) designed for an application at −25° C. with a mixture of C5K, HFO-1234ze and $CO_2$ gases, preferred in this case where the electric fields are not homogeneous. Furthermore, to avoid strikings between derivations, it is advantageous to sheath them with a heat-shrink sleeve.

The total pressure of gas inside the device with the mixture according to the invention is also chosen at 1.3 bars ($P_{tot}$=1300 hPa) for 20° C., and the mixture satisfies the conditions defined by Raoult's law, for example with a partial pressure comprised between 80 and 120 hPa for C5K in so far as possible. Given the size of the enclosure of this device (volume greater than 100 liters), it is preferable, in order to speed up the homogenisation of the gaseous mixture, to use bubblers; obviously, this option is not obligatory, particularly in the case of smaller devices or sufficient delay before experimentation.

Furthermore, since apart from the improvement of the dielectric strength on a direct line, fluoroketones make it possible to improve the tracking dielectric strength of the system, it is preferable to adsorb it on the walls of the insulators. Firstly, to line the internal walls of the device with C5K, this compound is injected pure into the enclosure, for example between 3 and 10 hPa; advantageously between 80 and 120 hPa of C5K, preferably at a temperature above ambient temperature in order to speed up the flow rate (for example, the reservoir containing the C5K may be heated), are injected via the "gas" output of the device. After this first step enabling the fluoroketone to be adsorbed on the walls, the filling of the device takes place by means of a gas mixture with double bubbler making it possible to control the ratio between C5K, HFO-1234ze and $CO_2$, this ratio being maintained constant in pressure at 20° C. throughout the filling thanks to the use of a precision mass flowmeter; for example, C5K is placed in the two bubblers through which $CO_2$ and the hydrofluoroolefin flow under pressure in order to attain complete saturation.

Tests on this type of device in which a permanent electrical current of 630 A RMS flows have shown that the heat at the level of the electrical contacts (the hottest points) is very similar to $SF_6$ for the ternary mixture according to the invention (as for binary mixtures): see FIG. 5, which gives the results in variation of the heating compared to $SF_6$.

Furthermore, it should be noted that the devices will be preferably equipped with one or more anhydrous calcium sulphate ($CaSO_4$) type molecular sieves, which absorb the small molecules created during the break. The toxicity of the gas is not increased after partial discharges by molecules that may have some toxicity.

Furthermore, at the end-of-life or after break tests, the gas is recovered using conventional recovery techniques using a compressor and a vacuum pump. Hydrofluoroolefin HFO-1234ze and fluoroketone C5K are then separated from the buffer gas using a zeolite capable of trapping only the buffer gas, smaller in size; alternatively, a selective separation membrane can allow nitrogen and/or $CO_2$ and/or air to escape and retains C5K and HFO-1234ze, which have a larger size and higher molecular mass; all other options could be considered.

Although the examples given above were made with HFO-1234ze, alternatives to this gas are possible. In particular, isomer HFO-1234yf (2,3,3,3-tetrafluoro-1-propene) can be used, with adaptations inherent to the properties of this gas: in particular, as shown in FIG. 6, since its boiling point is −30° C. (compared with −19° C. for HFO-1234ze), it is possible to use 50% more HFO-1234yf than HFO-1234ze, for the same operating temperature of −30° C. Since for a given filling pressure, the more HFO there is, and consequently the less buffer gas there is, and since the insulation and arc extinguishing properties depend on the mixture, the dielectric strength is increased.

The solution according to the invention thus makes it possible to propose a gaseous mixture with a low environmental impact (GWP reduced by more than 99.9% compared to an isolation with $SF_6$) compatible with the minimum service temperatures of the electrical device and with dielectric, break and thermal dissipation properties similar to what are obtained on existing devices. This mixture may directly replace the $SF_6$ used in the devices, without modifying or only slightly modifying their design: production lines can be kept, with simple change of filling gas and optionally with an addition of break aid systems or gas generating materials.

REFERENCES CITED

[1] EP 1 724 802
[2] WO 2008/073790
[3] WO 2009/049144

The invention claimed is:

1. A method of providing an electric insulating and/or electric arc extinguishing gaseous medium within a sealed enclosure of a medium-voltage electrical device comprising electrical components, the method comprising:
   enclosing the gaseous medium in the sealed enclosure,
   wherein the gaseous medium comprises a hydrofluoroolefin comprising three carbon atoms and a fluoroketone comprising five carbon atoms.

2. The method of claim 1, wherein the hydrofluoroolefin is trans-1,3,3,3-tetrafluoro 1-propene (HFO-1234ze), 2,3,3,3-tetrafluoro 1-propene (HFO-1234yf), or 1,2,2,5-pentafluoro-1-propene (HFO-1225ye).

3. The method of claim 1, wherein the fluoroketone is decafluoro-2-methylbutan-3-one.

4. The method of claim 1, wherein the gaseous medium further comprises a dilution gas.

5. The method of claim 4, wherein the dilution gas is air, nitrogen, oxygen, or carbon dioxide, or a mixture thereof.

6. The method of claim 1, wherein partial pressures of the fluoroketone and hydrofluoroolefin within the gaseous medium are defined according to Raoult's law so as not to create a liquid phase at a temperature of 3° C. below a minimum service temperature of a device comprising the sealed enclosure.

7. The method of claim 6, wherein a partial pressure of the fluoroketone is from 80 hPa to 120 hPa.

8. The method of claim 6, wherein the minimum service temperature is −40° C., −35° C., −30° C., −25° C., −20° C., −15° C., −10° C., −5° C., or 0° C.

9. A medium-voltage electrical device, comprising:
a sealed enclosure comprising electrical components; and
a gaseous medium provided within the sealed enclosure, the gaseous medium being an electric insulating and/or electric arc extinguishing gaseous medium,
wherein the gaseous medium comprises a hydrofluoroolefin comprising three carbon atoms and a fluoroketone comprising five carbon atoms.

10. The medium-voltage electrical device of claim 9, wherein
the hydrofluoroolefin is trans-1,3,3,3-tetrafluoro 1-propene (HFO-12134ze), 2,3,3,3-tetrafluoro 1-propene (HFO-1234yf), or 1,2,2,5-pentafluoro-1-propene (HFO-1225ye), and
the fluoroketone is decafluoro-2-methylbutan-3-one.

11. The medium-voltage electrical device of claim 9, wherein the gaseous medium further comprises a dilution gas.

12. The medium-voltage electrical device of claim 11, wherein the dilution gas is air, nitrogen, oxygen, or carbon dioxide, or a mixture thereof.

13. The medium-voltage electrical device of claim 9, wherein the hydrofluoroolefin and the fluoroketone are present in the gaseous medium with partial pressures defined according to Raoult's law so as not to create a liquid phase at a temperature of 3° C. below a minimum service temperature of the electrical device.

14. The medium-voltage electrical device of claim 9, which is a gas-insulated electrical transformer, a gas-insulated line for transporting or distributing electricity, or an electrical connection/disconnection device.

15. The medium-voltage electrical device of claim 9, wherein the sealed enclosure further comprises a $CaSO_4$ molecular sieve.

* * * * *